(12) United States Patent
Lu et al.

(10) Patent No.: US 10,109,674 B2
(45) Date of Patent: Oct. 23, 2018

(54) SEMICONDUCTOR METALLIZATION STRUCTURE

(71) Applicant: QUALCOMM Incorporated, San Diego, CA (US)

(72) Inventors: Yu Lu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/822,326

(22) Filed: Aug. 10, 2015

(65) Prior Publication Data

US 2017/0047374 A1 Feb. 16, 2017

(51) Int. Cl.
| | | |
|---|---|---|
| *H01L 27/22* | (2006.01) | |
| *H01L 23/528* | (2006.01) | |
| *H01L 43/12* | (2006.01) | |
| *G06F 17/50* | (2006.01) | |
| *H01L 23/522* | (2006.01) | |
| *H01L 43/02* | (2006.01) | |
| *H01L 43/08* | (2006.01) | |

(52) U.S. Cl.
CPC ........ *H01L 27/222* (2013.01); *G06F 17/5045* (2013.01); *H01L 23/528* (2013.01); *H01L 23/5226* (2013.01); *H01L 43/02* (2013.01); *H01L 43/08* (2013.01); *H01L 43/12* (2013.01)

(58) Field of Classification Search
CPC . H01L 27/222; H01L 23/5226; H01L 23/528; H01L 43/02; H01L 43/08; H01L 43/12; G06F 17/5045
See application file for complete search history.

(56) References Cited

U.S. PATENT DOCUMENTS

| | | | |
|---|---|---|---|
| 6,100,588 A | * | 8/2000 | McAdams ............ H01L 23/528 257/309 |
| 6,794,238 B2 | | 9/2004 | Lane et al. |
| 7,031,183 B2 | | 4/2006 | Kerszykowski et al. |
| 7,211,849 B2 | * | 5/2007 | Hineman ............... B82Y 25/00 257/295 |
| 8,674,465 B2 | | 3/2014 | Li et al. |
| 8,772,051 B1 | * | 7/2014 | Zhong ..................... H01L 43/12 438/3 |
| 2003/0073251 A1 | * | 4/2003 | Ning ..................... H01L 27/222 438/3 |
| 2006/0056250 A1 | | 3/2006 | Miura et al. |
| 2007/0023806 A1 | * | 2/2007 | Gaidis .................... B82Y 10/00 257/295 |
| 2008/0070165 A1 | * | 3/2008 | Fischer .............. H01L 21/0338 430/314 |
| 2010/0289098 A1 | | 11/2010 | Li et al. |

(Continued)

OTHER PUBLICATIONS

International Search Report and Written Opinion—PCT/US2016/041790—ISA/EPO—dated Oct. 13, 2016.

*Primary Examiner* — Mohsen Ahmadi
*Assistant Examiner* — Gustavo Ramallo
(74) *Attorney, Agent, or Firm* — Toler Law Group, PC

(57) ABSTRACT

A method of fabrication of a device includes forming a first metallization layer that is coupled to a logic device of the device. The method further includes forming a second metallization layer that is coupled to a magnetoresistive random access memory (MRAM) module of the device. The second metallization layer is independent of the first metallization layer.

9 Claims, 15 Drawing Sheets

(56) References Cited

U.S. PATENT DOCUMENTS

| | | | |
|---|---|---|---|
| 2011/0084314 A1* | 4/2011 | Or-Bach | G03F 9/7076 257/209 |
| 2012/0043630 A1 | 2/2012 | Omori et al. | |
| 2013/0234646 A1 | 9/2013 | Back et al. | |
| 2013/0235656 A1* | 9/2013 | Li | G11C 11/16 365/173 |
| 2014/0264668 A1 | 9/2014 | Lee et al. | |
| 2015/0311251 A1* | 10/2015 | Yi | H01L 27/222 257/421 |

* cited by examiner

SEMICONDUCTOR METALLIZATION STRUCTURE

I. FIELD

This disclosure is generally related to semiconductor devices and more particularly to semiconductor devices that include memory devices.

II. DESCRIPTION OF RELATED ART

Magnetoresistive random access memory (MRAM) devices may use resistance-based storage elements to store information. For example, a magnetic tunnel junction (MTJ) may be programmed to have either a low resistance state to indicate a first logic value (e.g., a logic zero value) or a high resistance state to indicate a second logic value (e.g., a logic one value).

Some semiconductor devices integrate an MRAM device with one or more other components in a single integrated circuit. For example, an integrated circuit may include a substrate, a device formed on the substrate, and an MRAM device formed above the device using metallization layers of the integrated circuit. In this example, the MRAM device and the device may "share" the metallization layers. For example, the metallization layers may include wiring associated with both devices.

In some circumstances, forming the MRAM device in the metallization layers may increase fabrication cost and complexity of the integrated circuit. For example, if wiring of the MRAM device and wiring of the device "share" a metallization layer, a design of the integrated circuit may be modified in order to comply with fabrication design rules or to comply with a physical layout of the integrated circuit. Modifying the design of the integrated circuit may increase production cost.

III. SUMMARY

One or more components associated with a memory device (e.g., a magnetoresistive random access memory (MRAM) device) are formed using a dedicated (or "customized") metallization layer. The dedicated metallization layer may be used to create a bit line coupled to the MRAM device or to form a contact coupled to the MRAM device, as illustrative examples. The dedicated metallization layer may be "inserted" between metallization layers specified by a metallization process. For example, if a back-end-of-line (BEOL) metallization process specifies n metallization layers, fabricating an MRAM device may include forming n+1 metallization layers instead of forming n metallization layers (where n indicates the number of metallization layers specified by the metallization process).

The dedicated metallization layer may be positioned between a particular metallization layer and another metallization layer that is less dense than the particular metallization layer. For example, the dedicated metallization layer may be positioned above a "dense metal layer" and below a "thick metal layer" specified by the metallization process. By forming the MRAM device between the dense metallization layer and the thick metal layer, the size of resistance-based storage elements of the MRAM device may be reduced using "dense" feature sizes allowed by the dense metal layer (resulting in high data storage density) while also enabling the thick metal layer to couple the MRAM device to other device components (e.g., a logic region, such as a processor or other device). By using the thick metal layer to couple the MRAM device to the other device components (instead of using one or more dense metal layers), "sharing" of the dense metal layers among the MRAM device and the other device components may be avoided or reduced. For example, a structure (e.g., a bit line or a contact) associated with the MRAM device may be independent of (e.g., may be formed using one or more different metallization layers as compared to) wiring of the other device components (instead of "sharing" a metallization layer for the structure and the wiring, which can increase fabrication cost and complexity).

Further, use of the thick metal layer to connect the MRAM device to the other device components may reduce parasitic effects of the MRAM device on the other device components. For example, device components fabricated using thicker metal may cause fewer resistive-capacitive (RC) parasitic effects on other device components (as compared to fabrication using a thinner metal). Fabricating the MRAM device using a thicker metal may therefore reduce RC parasitic effects of the MRAM device on the other device components (and vice versa). As another example, avoiding "sharing" of a metallization layer among wiring of the MRAM device and the other components may reduce parasitic effects of the MRAM device on the other device components (and vice versa). Reducing parasitic effects may simplify a design process associated with integrating an MRAM device and other components on a single integrated circuit, such as by avoiding re-simulation of the design, requalification of the design, modification of a layout of the device, or modification of an RC parasitic model associated with the design.

In a particular example, a method of fabrication of a device includes forming a first metallization layer that is coupled to a logic device of the device. The method further includes forming a second metallization layer that is coupled to an MRAM module of the device. The second metallization layer is independent of the first metallization layer.

In another particular example, a computer-readable medium stores instructions that are executable by a processor to cause the processor to initiate operations during fabrication of a device. The operations include forming a first metallization layer that is coupled to a logic device of the device. The operations further include forming a second metallization layer that is coupled to an MRAM module of the device. The second metallization layer is independent of the first metallization layer.

In another particular example, an apparatus includes a first structure of a first metallization layer. The first structure is coupled to a logic device of an integrated circuit. The apparatus further includes a second structure of a second metallization layer. The second structure is coupled to one or more resistance-based storage elements of an MRAM module of the integrated circuit. The second structure is independent of the first structure.

In another particular example, a method of generating a data file includes receiving design information representing at least one physical property of a semiconductor device. The semiconductor device includes a first structure of a first metallization layer of an integrated circuit. The first structure is coupled to a logic device. The semiconductor device further includes a second structure of a second metallization layer. The second structure is coupled to one or more resistance-based storage elements of an MRAM module of the integrated circuit. The second structure is independent of the first structure. The method further includes transforming the design information to comply with a file format and generating a data file including the transformed design information.

One particular advantage provided by at least one of the disclosed examples is simplified integration of multiple devices on an integrated circuit. For example, because one or more structures of an MRAM module are independent of other components (e.g., a logic device), integration of the MRAM module and the other components may be simplified (e.g., by avoiding re-simulation of the design, requalification of the design, modification of a layout of the device, or modification of an RC parasitic model associated with the design) as compared to a device that "shares" a metallization layer among certain components. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
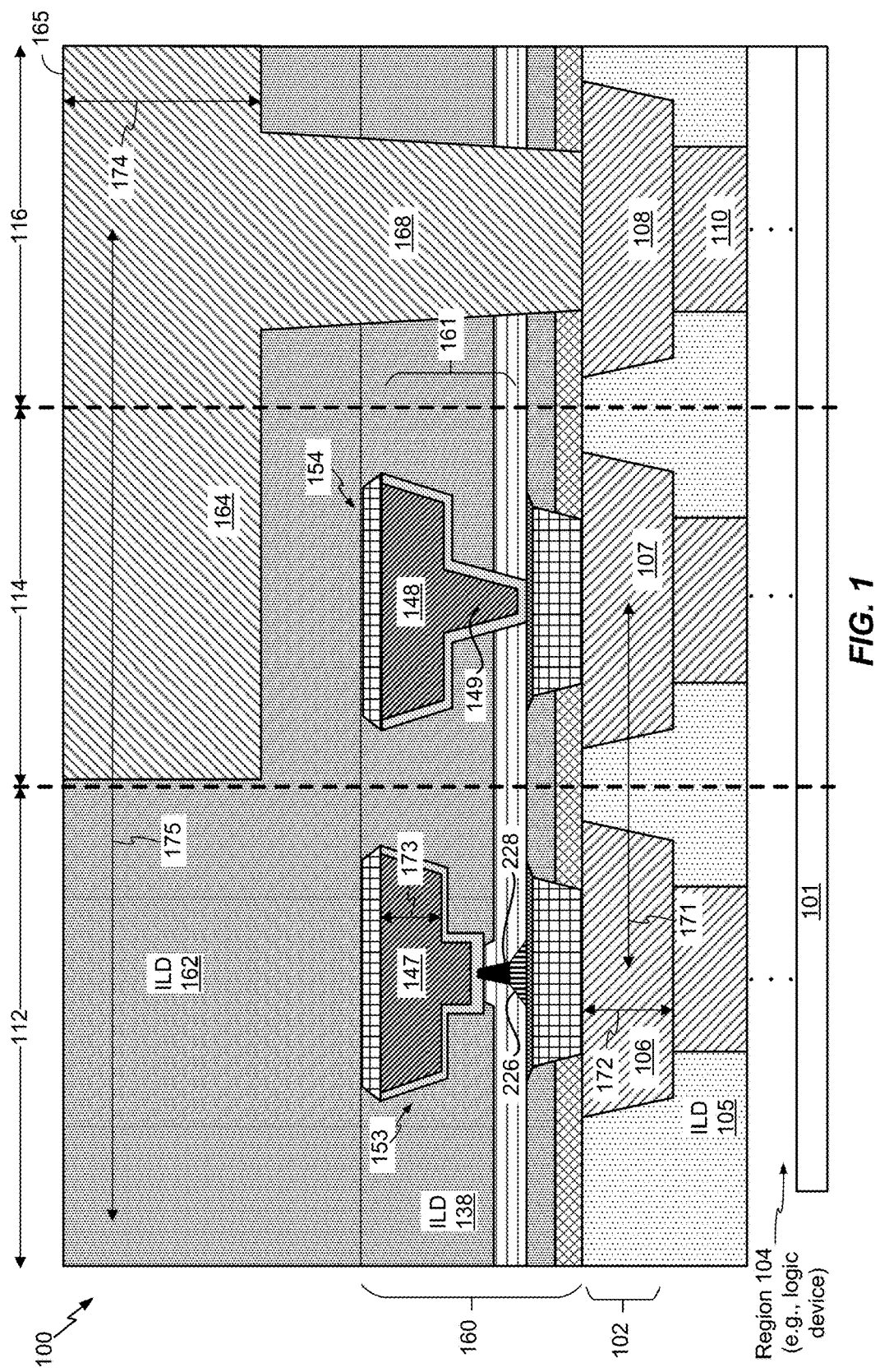
FIG. 1 depicts a first particular illustrative example of a device, such as a device that may be fabricated using a first fabrication process.

Referring to FIG. 1, a particular illustrative example of a device is depicted and generally designated 100. The device 100 may be included within an integrated circuit, such as a semiconductor die.

The device 100 includes a substrate 101, such as a silicon substrate. The device 100 further includes a region 104. The region 104 may include one or more devices formed using a plurality of layers of the device 100. For example, the region 104 may include a logic device (e.g., a processor, or another device) that is formed using a complementary metal-oxide-semiconductor (CMOS) logic process. The region 104 may further include wiring associated with the logic device. For example, the wiring may connect the logic device to the via 110.

The device 100 further includes one or more first structures formed using a plurality of metallization layers, such as a plurality of metallization layers associated with a back-end-of-line (BEOL) metallization process. To illustrate, FIG. 1 depicts a first portion 106 (e.g., a first contact) of a first metallization layer 102, a second portion 107 (e.g., a second contact) of the first metallization layer 102, and a third portion 108 (e.g., a third contact) of the first metallization layer 102. The first metallization layer 102 may be formed using a deposition process (e.g., by depositing metal, such as a copper, in accordance with a damascene process). A first interlayer dielectric (ILD) 105 may be filled around the portions 106-108, and one or more vias may connect the portions 106-108 to a logic device included in the region 104. For example, a via 110 may connect the third portion 108 to a logic device included in the region 104. The portions 106-108 and the via 110 may be associated with (e.g., may be coupled to) a logic device, such as a logic device formed within the region 104.

The device 100 may further include a magnetoresistive random access memory (MRAM) module 160 formed above the first metallization layer 102. The MRAM module 160 may include a plurality of resistance-based storage elements, such as a representative resistance-based storage element 226. Each resistance-based storage element of the device 100 may include a magnetic tunnel junction (MTJ) device that may be adjusted to either a low resistance state to indicate a first logic value (e.g., a logic zero value) or a high resistance state to indicate a second logic value (e.g., a logic one value). The resistance-based storage element 226 may include (or may be connected to) a coupling element 228. It should be appreciated that the example of FIG. 1 is illustrative and that the device 100 may include more than one resistance-based storage element.

The MRAM module 160 may further include one or more components formed using a second metallization layer 161 (e.g., by depositing metal, such as copper, in accordance with a damascene process). To illustrate, the MRAM module 160 may include a module contact 153 and an array contact 154. The module contact 153 may include a first portion of the second metallization layer 161 (e.g., a bit line 147), and the array contact 154 may include a second portion 148 of the second metallization layer 161 and a via 149 of the second metallization layer 161. The bit line 147 and the array contact 154 may be associated with (e.g., coupled to or integrated within) the MRAM module 160. The bit line 147 may be configured to bias one or more resistance-based storage elements of the MRAM module 160 (e.g., the resistance-based storage element 226). A second ILD 138 may be filled around the module contact 153 and the array contact 154. The second ILD 138 may include a porous, low-k material (where k indicates a dielectric constant of the dielectric material) or a conventional dielectric material, e.g. silicon oxide.

The device 100 may further include one or more components formed using a third metallization layer 165 (e.g., by etching a materials to form a cavity and a trench and by filling copper in the cavity and the trench, such as using a dual damascene process). For example, copper may be filled in the cavity to form a via 168, and copper may be filled in the trench to form a metal region 164. A third ILD 162 may be filled around the metal region 164 and the via 168.

The device 100 further includes an MRAM region 112, an edge region 114, and a logic region 116. The MRAM region 112 may include a plurality of resistance-based storage elements (e.g., a memory including the resistance-based storage element 226), the module contact 153, and the first portion 106. The edge region 114 may be adjacent to the MRAM region 112 and the logic region 116. The edge region 114 may include the array contact 154 and the second portion 107. The logic region 116 may include the metal region 164, the via 168, the third portion 108, and the via 110. The semiconductor devices that may be fabricated under the metallization layers are not shown in FIG. 1 or any subsequent figures, for clarity.

The first metallization layer 102 may correspond to a dense metal layer formed during fabrication of the device 100. As used herein, a "dense" a metal layer may have a relatively small pitch (resulting in components that are relatively near to one another, or relatively "dense"). To illustrate, a BEOL metallization process may specify a first pitch 171 associated with the first metallization layer 102, such as a "minimum" pitch of the BEOL metallization process. The BEOL metallization process may specify that components of the device 100 formed using metallization layers deposited after the first metallization layer 102 may have a greater pitch than the first pitch 171. For example, the third metallization layer 165 may be a "thick" metal layer that is to have at least a second pitch 175 (which is greater than the first pitch 171 of the first metallization layer 102).

As a non-limiting, illustrative example, the BEOL metallization process may specify that metallization layers one, two, three, four, and five (M1, M2, M3, M4, and M5) may have a pitch corresponding to the first pitch 171. The BEOL metallization process may further specify that a second pitch (e.g., the second pitch 175) associated with metallization layers formed above metallization layers M1-M5 (such as metallization layer six (M6)) is to be greater than the first pitch 171 (e.g., approximately twice the first pitch 171 or more). In this example, the region 104 may include the metallization layers M1-M4, the first metallization layer 102 may correspond to the metallization layer M5, and the third metallization layer 165 may correspond to the metallization layer M6. In this case, one or more components of the MRAM module 160 (e.g., the module contact 153 and the array contact 154) may be formed by "inserting" the second metallization layer 161 between the metallization layers M5 and M6.

To further illustrate, a first structure of the first metallization layer 102 may have a first thickness 172. The first structure may include any of the portions 106-108 or the via 110, as illustrative examples. A second structure of the second metallization layer 161 may have a second thickness 173. For example, the second structure may include the bit line 147, the second portion 148, or the via 149. A third structure of the third metallization layer 165 may have a third thickness 174 that is greater than the first thickness 172. For example, the BEOL metallization process may specify that the third thickness 174 is to be greater than the first thickness 172. The second thickness 173 may be independent of the first thickness 172 and the third thickness 174. For example, the BEOL metallization may not specify the second thickness 173. In some implementations, the second thickness 173 may be set equal to the first thickness 172 (e.g., a minimum thickness in order to increase data storage density of the MRAM module 160).

Use of an MRAM-specific metallization layer (e.g., the second metallization layer 161) may facilitate a high data storage density of the MRAM module 160 (by using a reduced pitch of the first metallization layer 102 to fabricate components, such as the resistance-based storage element 226) while also avoiding "sharing" of a particular metallization layer among the MRAM module 160 and one or more components of the region 104 (e.g., a logic device included in the region 104). Avoiding "sharing" of a metallization layer may simplify device design and fabrication, reducing device cost.

To further illustrate, an example of a first fabrication process to fabricate the device 100 is described with reference to FIGS. 2-7. It should be appreciated that the first fabrication process is described for purposes of illustration and that other fabrication processes are within the scope of the disclosure.

Figure 2:
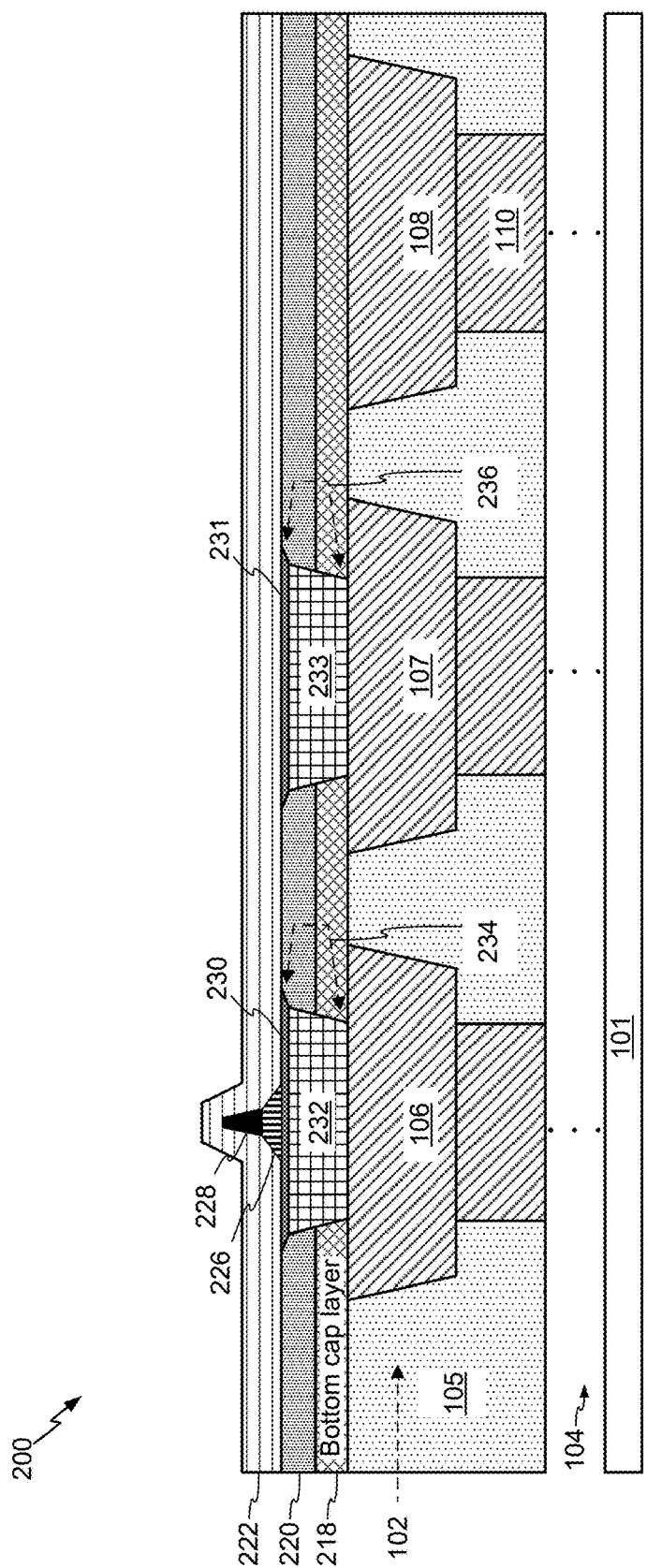
FIG. 2 depicts a particular illustrative example of a device during a first stage of the first fabrication process.

Referring to FIG. 2, a device during a first stage of the first fabrication process is depicted and generally designated 200. In FIG. 2, the device 200 includes a bottom cap layer 218 (e.g., a copper cap layer). A buffer layer 220 may be formed on the bottom cap layer 218 (e.g., using a deposition process). The buffer layer 220 may include an oxide material, a silicon oxide material, a silicon nitride material, another material, or a combination thereof. The buffer layer 220 may be smoothed or planarized, such as using a chemical-mechanical planarization (CMP) process.

The device 200 may further include a first bottom electrode 234 and a second bottom electrode 236. The bottom electrodes 234, 236 may be formed in cavities (e.g., cavities created using an etch process) of the bottom cap layer 218 and the buffer layer 220. The bottom electrodes 234, 236 may include a conductive material 232, 233, such as a tantalum nitride (TaN) or a tungsten (W) material. The first bottom electrode 234 may further include a material 230, such as a tantalum nitride (TaN) material, and the second bottom electrode 236 may further include a material 231, such as a TaN material. The materials 230, 231 may be formed using a plasma vapor deposition (PVD) process, as an illustrative example.

The resistance-based storage element 226 may be formed on the first bottom electrode 234. For example, a plurality of layers (e.g., a free layer, a tunnel barrier layer, and a fixed layer) may be formed (e.g., using one or more PVD processes) and etched (e.g., using an etch process) to define an MTJ device of the resistance-based storage element 226. In some applications, the MTJ device may be formed using one or more lithographic processes. In some implementations, the coupling element 228 functions as a mask during the etch process (to protect the resistance-based storage element during the etch process). The coupling element 228 may include a TaN material, a titanium nitride (TiN) material, another material, or a combination thereof.

The device 200 may further include a passivation layer 222. For example, the passivation layer 222 may include a silicon nitride material, a silicon oxide material, an aluminum oxide material, another material, or a combination thereof.

Figure 3:
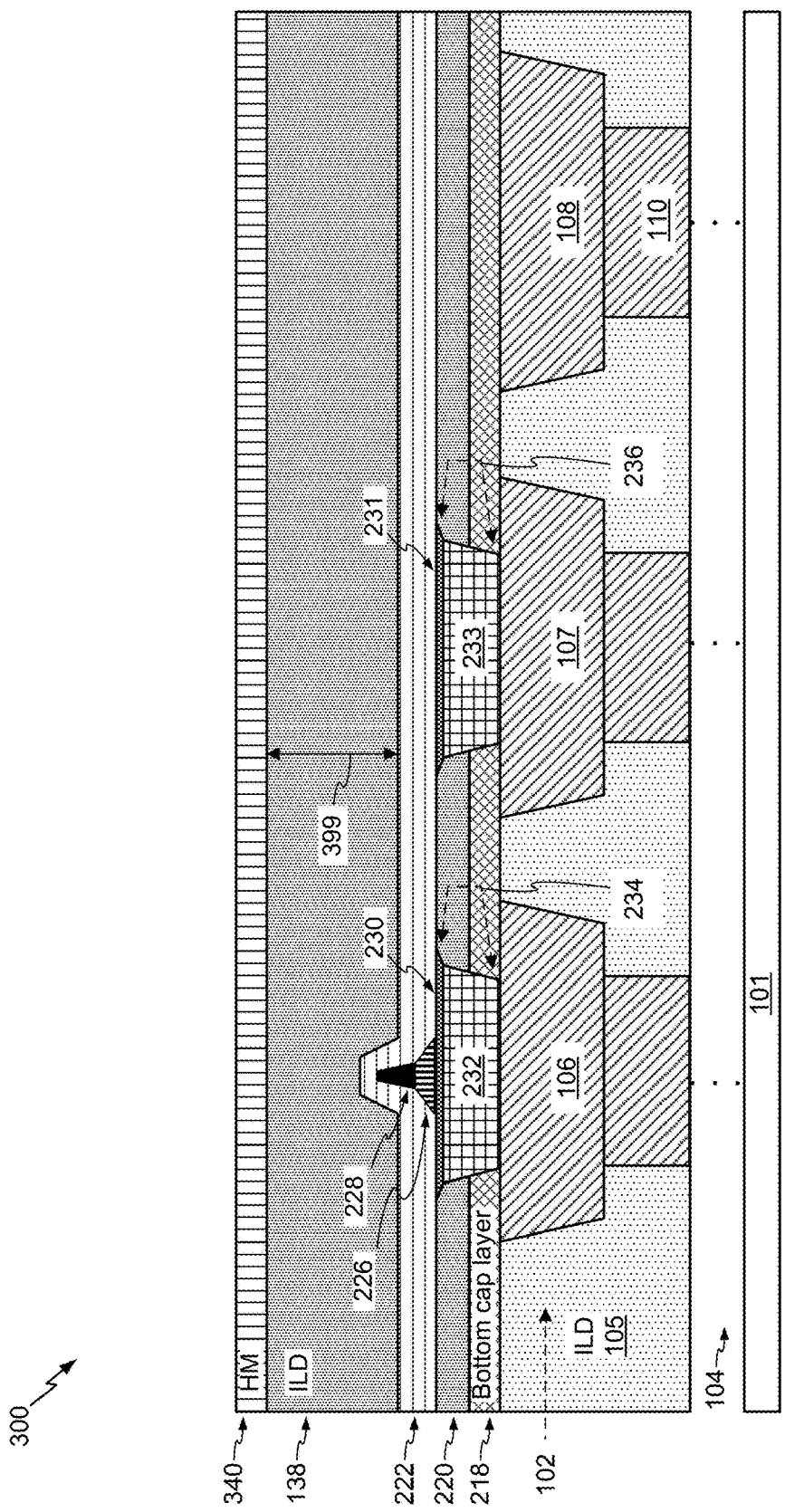
FIG. 3 depicts a particular illustrative example of a device during a second stage of the first fabrication process.

Referring to FIG. 3, a device during a second stage of the first fabrication process is depicted and generally designated 300. In FIG. 3, the second ILD 138 has been formed (e.g., using a growth process) on the passivation layer 222. A hard mask (HM) 340 may be formed (e.g., using a PVD process) on the second ILD 138. The HM 340 may include a TiN material, another material, or a combination thereof.

In some cases, a first height 399 of the second ILD 138 is selected based one or more characteristics of the MRAM module 160 of FIG. 1, the second metallization layer 161 of FIG. 1, or both. To illustrate, a BEOL metallization process associated with the metallization layers 102, 165 may specify a second height of the second ILD 138 that is less than the first height 399. The first height 399 may be selected (instead of the second height) to accommodate one or more components of the MRAM module 160 of FIG. 1, the second metallization layer 161 of FIG. 1, or both. For example, the first height 399 may be selected to enable use of a damascene process that includes etching of cavities in the second ILD 138, as described further with reference to FIG. 4.

Figure 4:
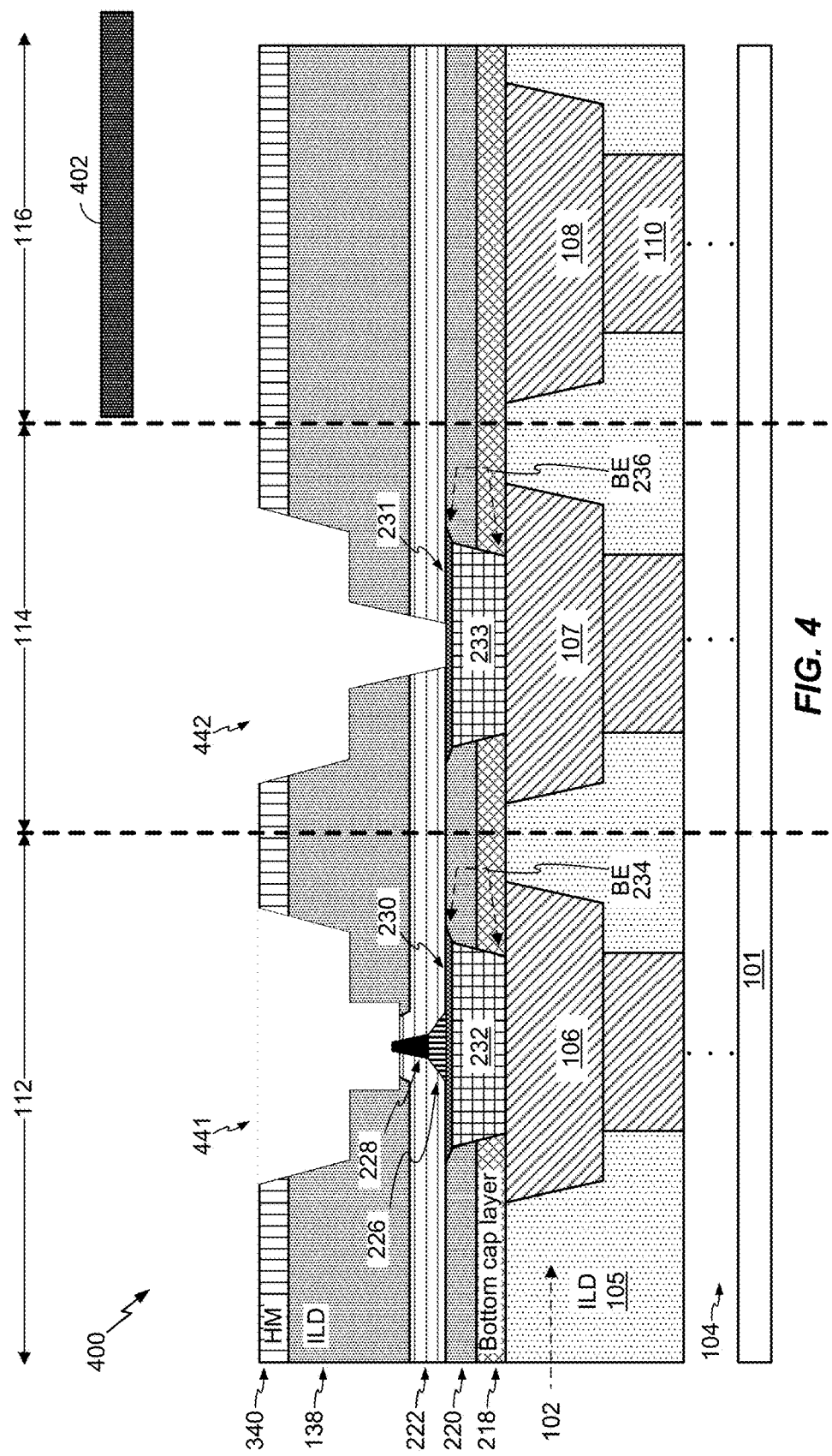
FIG. 4 depicts a particular illustrative example of a device during a third stage of the first fabrication process.

Referring to FIG. 4, a device during a third stage of the first fabrication process is depicted and generally designated 400. In FIG. 4, a first cavity 441 and a second cavity 442 have been created. For example, an etch process may be performed to etch the HM 340, the second ILD 138, and the passivation layer 222.

In some implementations, a protective device 402 is used during one or more operations of the first fabrication process. For example, the protective device 402 may include a shield, a cover, a mask, or another device that protects (e.g., isolates) the logic region 116 during one or more operations targeting the MRAM region 112 and the edge region 114 (e.g., during an etch process used to create the cavities 441, 442). In other implementations, use of the protective device 402 may be omitted from the first fabrication process (e.g., by using one or more "dummy" processes instead of the protective device 402, such as a dummy etch and a dummy fill).

Figure 5:
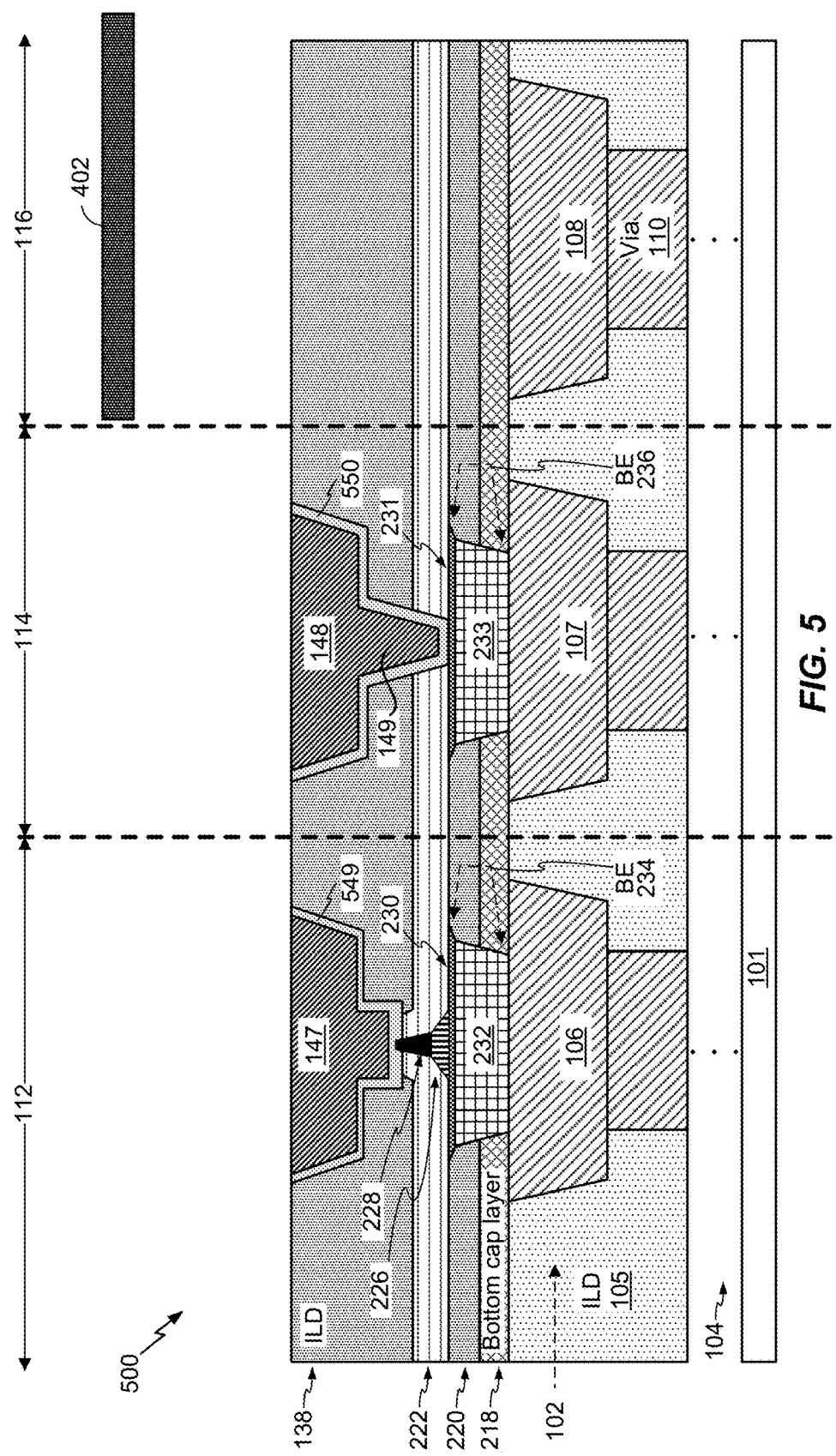
FIG. 5 depicts a particular illustrative example of a device during a fourth stage of the first fabrication process.

Referring to FIG. 5, a device during a fourth stage of the first fabrication process is depicted and generally designated 500. In FIG. 5, a first barrier layer 549 and a second barrier layer 550 have been formed in the cavities 441, 442 of FIG. 4, respectively. FIG. 5 also illustrates that the bit line 147, the second portion 148, and the via 149 have been formed on the barrier layers 549, 550.

In an illustrative implementation, the barrier layers 549, 550, the bit line 147, the second portion 148, and the via 149 are formed using a damascene process (e.g., a dual damascene process) that includes pre-cleaning the cavities 441, 442 of FIG. 4 and depositing a barrier material within the cavities 441, 442 to form the barrier layers 549, 550. The damascene process may further include forming a seed layer on the barrier layers 549, 550 and plating the seed layer to form the bit line 147, the second portion 148, and the via 149. After forming the bit line 147, the second portion 148, and the via 149, the damascene process may also include performing a smoothing or planarization process (e.g., a CMP process) to form the device 500 of FIG. 5. In some implementations, the protective device 402 may be used to protect the logic region 116 during one or more operations of the damascene process.

Depending on the particular application, the via 149 may have a "custom" size (e.g., height). For example, the via 149 may have a height that is different than a height of the via 168 of FIG. 1. As another example, a BEOL metallization process associated with the metallization layers 102, 165 may specify a height of the via 168 (without specifying a height of the via 149). In some cases, the via 149 may be fabricated using a "custom" mask (e.g., a mask that is formed based on one or more physical characteristics of the via 149, such as based on the height of the via 149).

Figure 6:
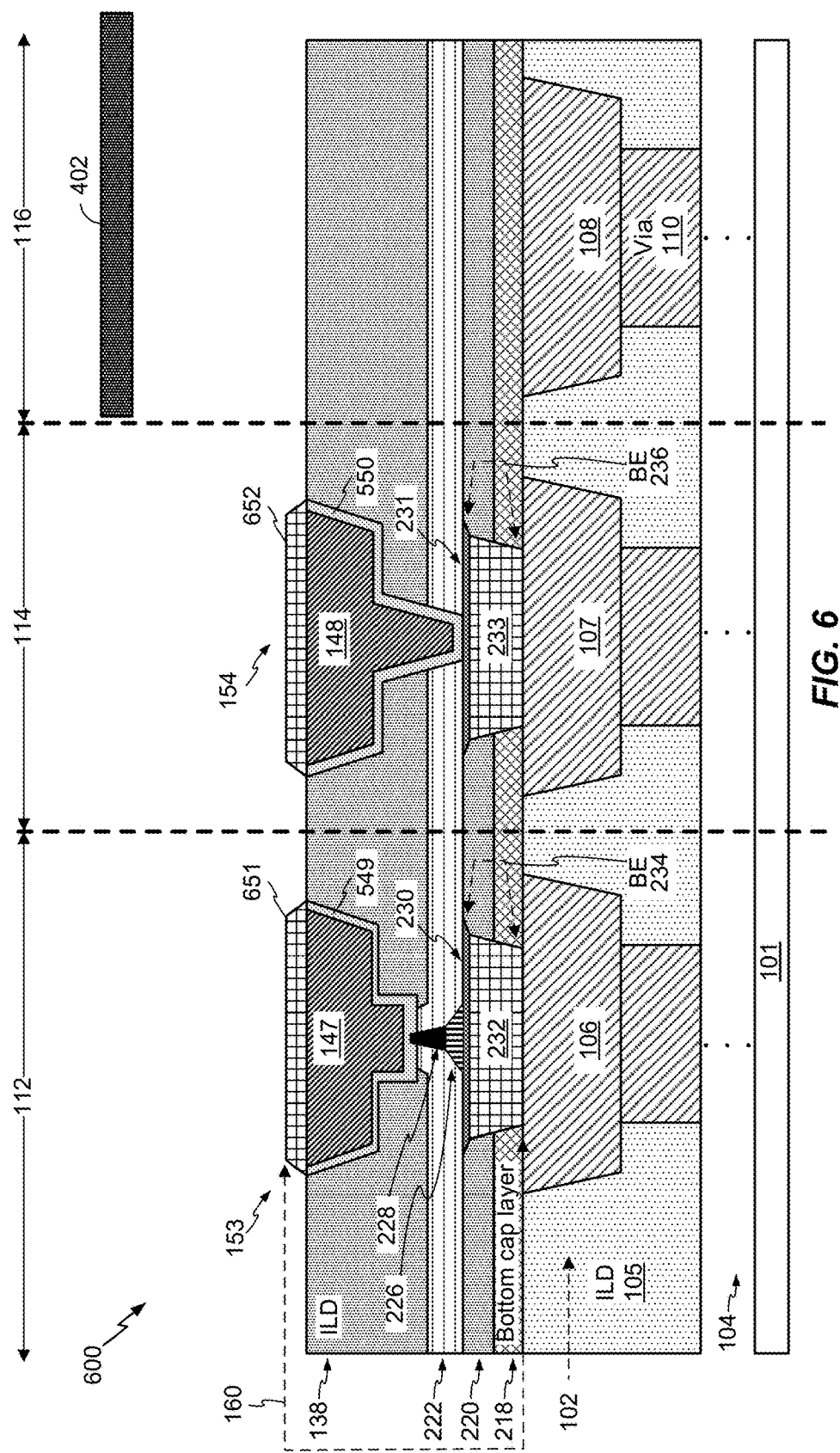
FIG. 6 depicts a particular illustrative example of a device during a fifth stage of the first fabrication process.

Referring to FIG. 6, a device during a fifth stage of the first fabrication process is depicted and generally designated 600. In FIG. 6, a first electro-migration (EM) cap 651 and a second EM cap 652 have been formed on the bit line 147 and on the second portion 148, respectively. For example, the EM caps 651, 652 may be formed by depositing a material, e.g., using a self-aligned process. The EM caps 651, 652 may include a CoWP material, another material, or a combination thereof. In some implementations, the protective device 402 may be used to protect the logic region 116 during formation of the EM caps 651, 652.

Figure 7:
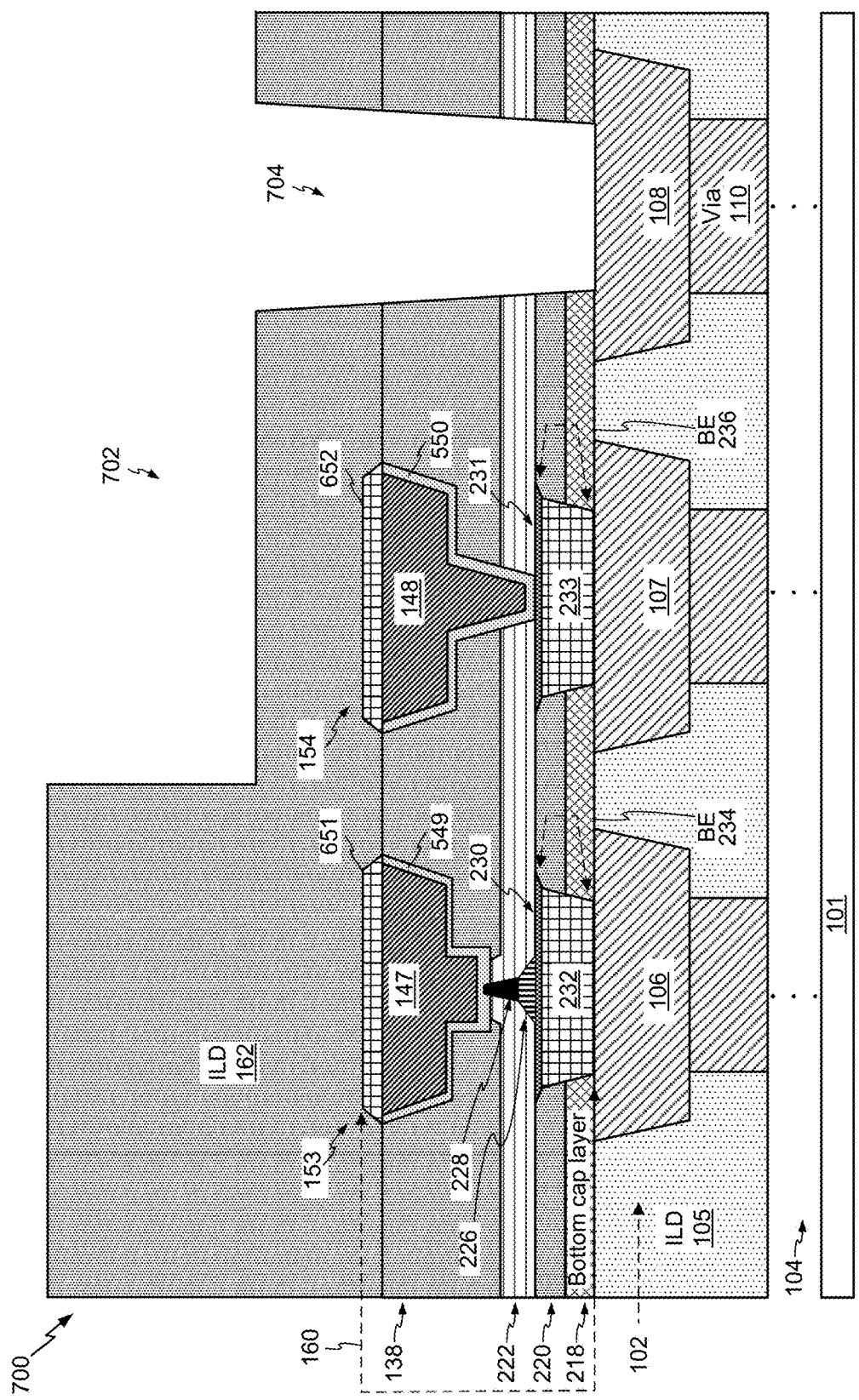
FIG. 7 depicts a particular illustrative example of a device during a sixth stage of the first fabrication process.

Referring to FIG. 7, a device during a sixth stage of the first fabrication process is depicted and generally designated 700. In FIG. 7, the third ILD 162 has been formed (e.g., using a growth process) and etched (e.g., using an etch process) to define a trench 702 and a cavity 704. In implementations where the protective device 402 is used to protect the logic region 116, the protective device 402 may be removed prior to defining the trench 702 and the cavity 704.

The first fabrication process described with reference to FIGS. 2-7 may also include forming the metal region 164 of FIG. 1 within the trench 702 and forming the via 168 of FIG. 1 within the cavity 704 to form the device 100 of FIG. 1. For example, a thick metal dual damascene process may include depositing a metal (e.g., copper) within the trench 702 and within the cavity 704 and planarizing the metal (e.g., using a CMP process) to form the device 100 of FIG. 1. The thick metal dual damascene process may be associated with certain metallization layers (e.g., the third metallization layer 165) having a greater pitch than other metallization layers (e.g., the first metallization layer 102).

FIGS. 8-12 depict stages associated with a second fabrication process. For example, referring to FIG. 12, the second fabrication process may be used to form a device 1200. In some applications, the second fabrication process may reduce a number of masks used as compared to the first fabrication process by avoiding fabrication of the via 149, as described further below. It should be appreciated that the second fabrication process is described for purposes of illustration and that other fabrication processes are within the scope of the disclosure.

Figure 8:
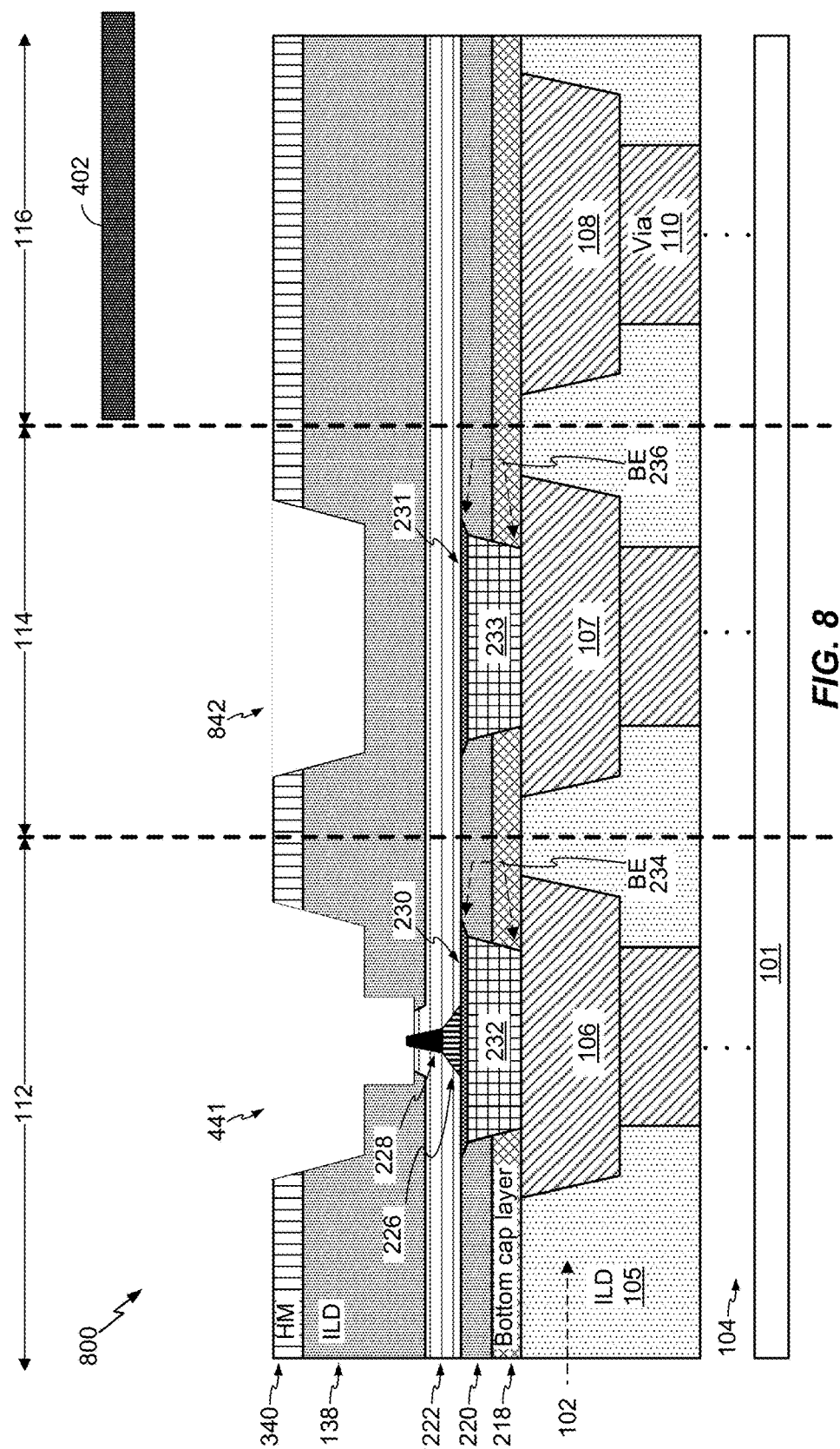
FIG. 8 depicts a particular illustrative example of a device during a first stage of a second fabrication process.

Referring to FIG. 8, a device during a first stage of the second fabrication process is depicted and generally designated 800. Certain features of the device 800 may correspond to features described with reference to FIGS. 1-7. In the example of FIG. 8, the device 800 may include a second cavity 842 (instead of the second cavity 442 of FIG. 4). For example, an etch process used to define the second cavity 842 may stop prior to reaching the second bottom electrode 236 (instead of reaching the second bottom electrode 236 to expose a surface of the second bottom electrode 236 as in the example of FIG. 4).

In some implementations, the protective device 402 is used during one or more operations of the second fabrication process. For example, the protective device 402 may include a shield, a cover, a mask, or another device that protects (e.g., isolates) the logic region 116 during one or more operations targeting the MRAM region 112 and the edge region 114 (e.g., during an etch process used to create the cavities 441, 842). In other implementations, use of the protective device 402 may be omitted from the second fabrication process (e.g., by using one or more "dummy" processes instead of the protective device 402, such as a dummy etch and a dummy fill).

Figure 9:
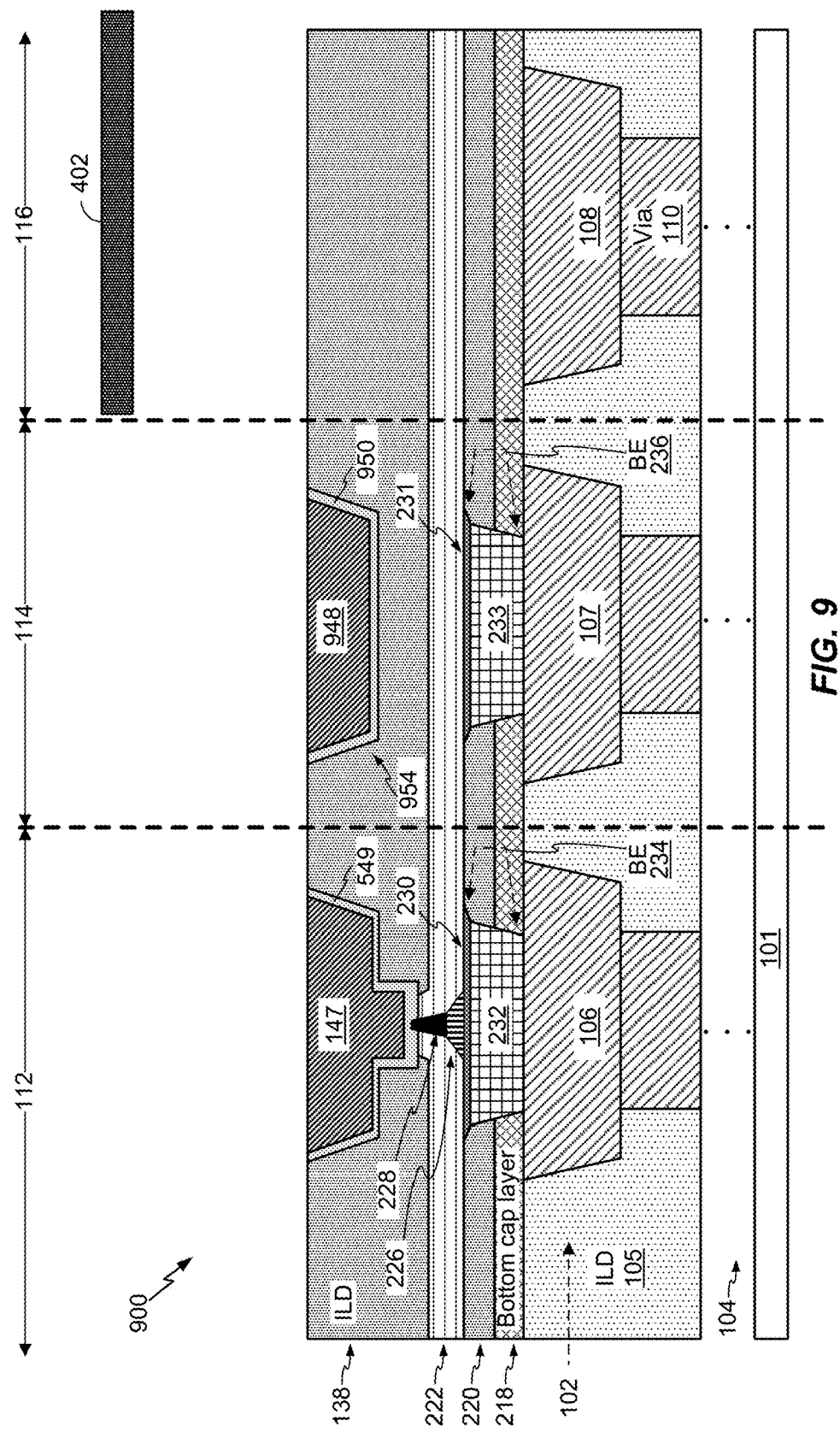
FIG. 9 depicts a particular illustrative example of a device during a second stage of the second fabrication process.

Referring to FIG. 9, a device during a second stage of the second fabrication process is depicted and generally designated 900. The device 900 includes an array contact 954 formed within the second cavity 842 of FIG. 8. The array contact 954 may include a barrier layer 950 and a second portion 948.

In an illustrative implementation, the barrier layers 549, 950, the bit line 147, and the second portion 948 are formed using a damascene process (e.g., a single damascene process) that includes pre-cleaning the cavities 441, 842 of FIG. 8 and depositing a barrier material within the cavities 441, 842 to form the barrier layers 549, 950. The damascene process may further include forming a seed layer on the barrier layers 549, 950 and plating the seed layer to form the bit line 147 and the second portion 948. After forming the bit line 147 and the second portion 948, the damascene process may also include performing a smoothing or planarization process (e.g., a CMP process) to form the device 900 of FIG. 9. In some implementations, the protective device 402 may be used to protect the logic region 116 during one or more operations of the damascene process.

Figure 10:
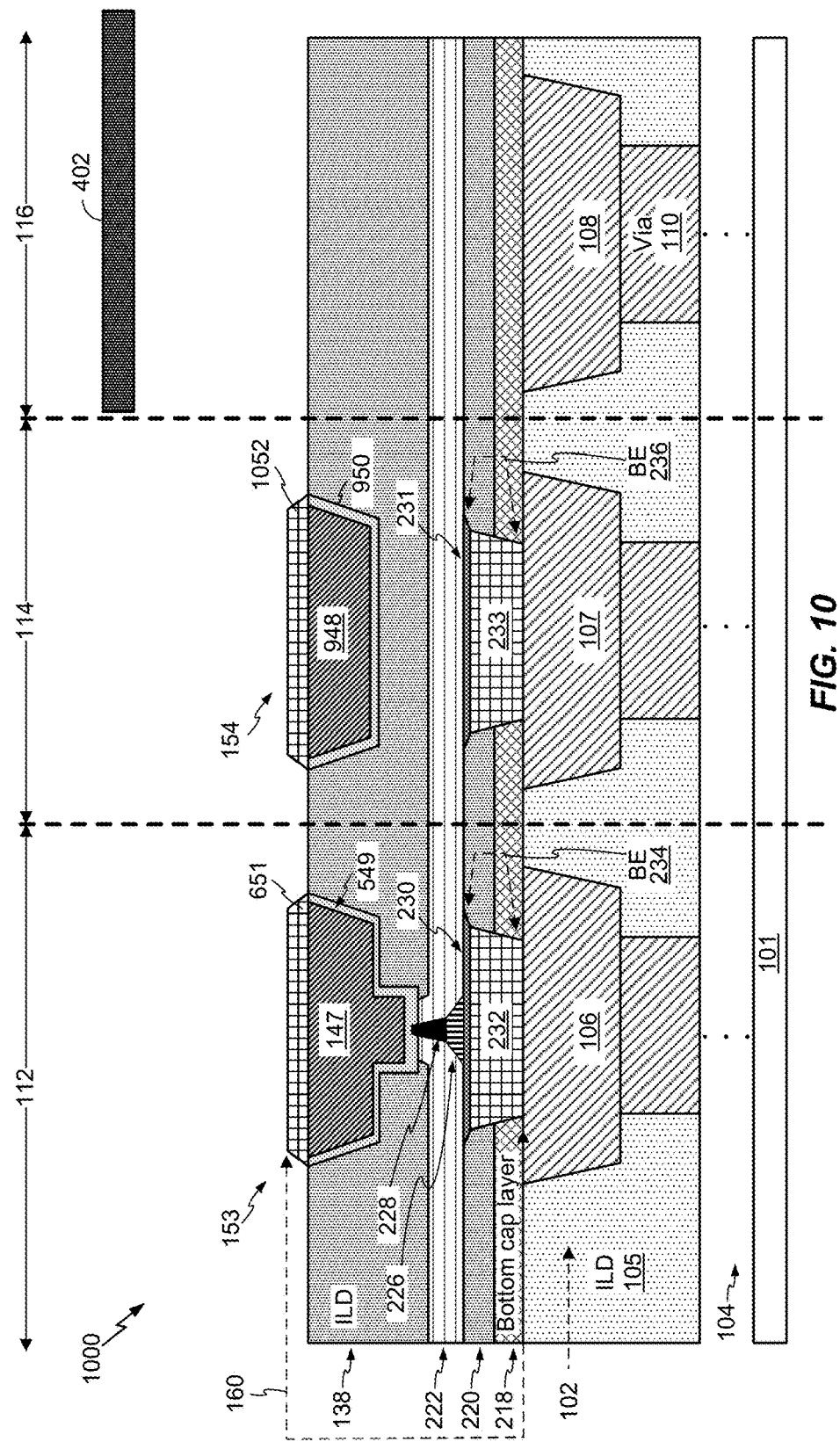
FIG. 10 depicts a particular illustrative example of a device during a third stage of the second fabrication process.

Referring to FIG. 10, a device during a third stage of the second fabrication process is depicted and generally designated 1000. In FIG. 10, the first EM cap 651 and a second EM cap 1052 have been formed on the bit line 147 and on the second portion 948, respectively. For example, the EM caps 651, 1052 may be formed by depositing a material, e.g., using a self-aligned process. The EM caps 651, 1052 may include a CoWP material, another material, or a combination thereof. In some implementations, the protective device 402 may be used to protect the logic region 116 during formation of the EM caps 651, 1052.

Figure 11:
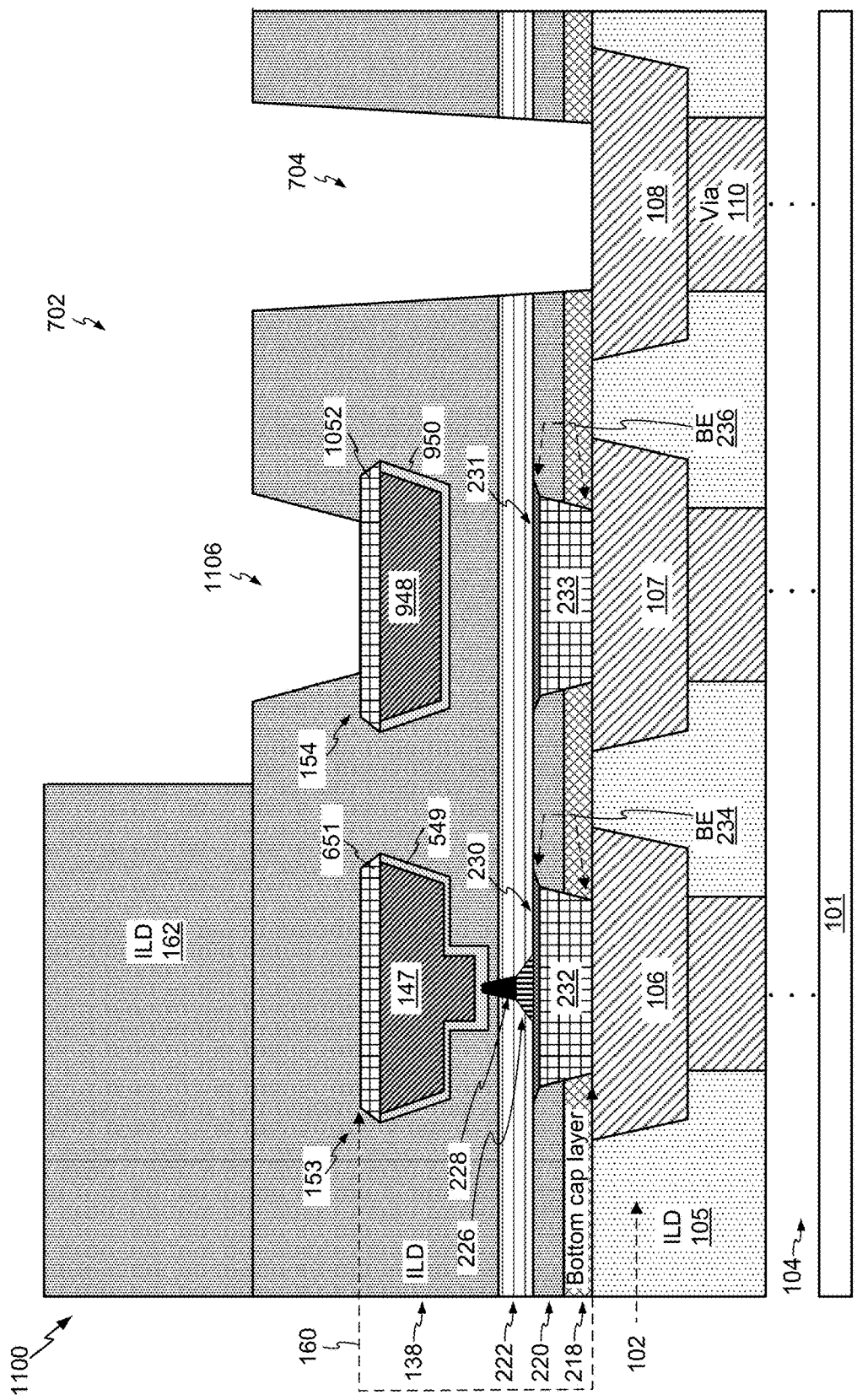
FIG. 11 depicts a particular illustrative example of a device during a fourth stage of the second fabrication process.

Referring to FIG. 11, a device during a fourth stage of the second fabrication process is depicted and generally designated 1100. In FIG. 11, the third ILD 162 has been formed (e.g., using a growth process) and etched (e.g., using an etch process) to define the trench 702, the cavity 704, and a cavity 1106. Forming the cavity 704 may expose a surface of the third portion 108, and forming the cavity 1106 may expose a surface of the second EM cap 1052. In implementations where the protective device 402 is used to protect the logic region 116, the protective device 402 may be removed prior to defining the trench 702 and the cavities 704, 1106.

Figure 12:
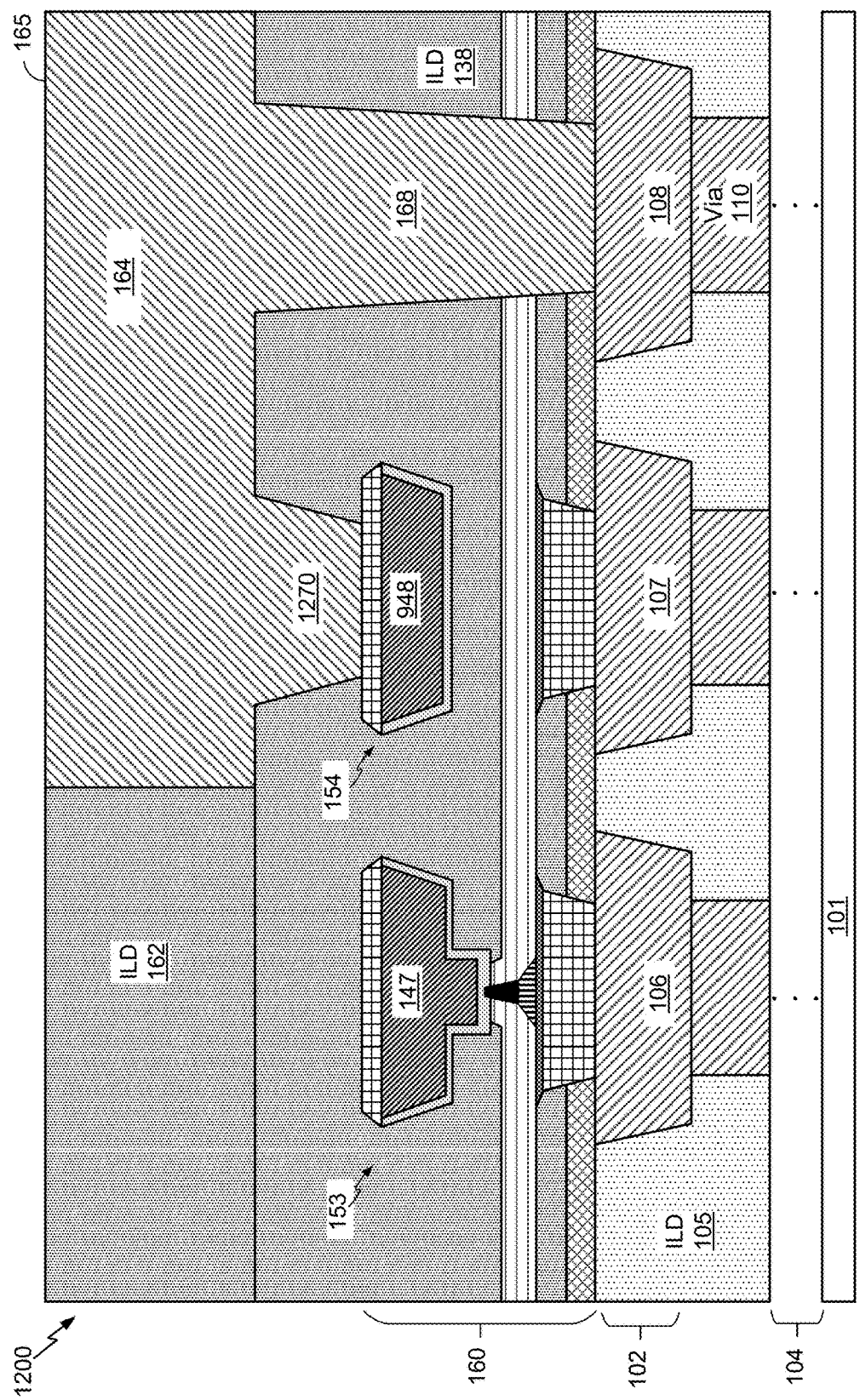
FIG. 12 depicts a particular illustrative example of a device during a fifth stage of the second fabrication process.

Referring to FIG. 12, a device during a fifth stage of the second fabrication process is depicted and generally designated 1200. The device 1200 may include the metal region 164 (within the trench 702), the via 168 (within the cavity 704), and a via 1270 (within the cavity 1106). The via 1270 is coupled to the second EM cap 1052 and is also coupled to the metal region 164.

The metal region 164 and the vias 168, 1270 may be formed using a thick metal dual damascene process. The thick metal dual damascene process may include depositing a metal (e.g., copper) within the trench 702 and within the cavities 704, 1106 and planarizing the metal (e.g., using a CMP process) to form the device 1200. The thick metal dual damascene process may be associated with certain metallization layers (e.g., the third metallization layer 165) having a greater pitch than other metallization layers (e.g., the first metallization layer 102).

In some applications, the second fabrication process may use one less mask as compared to the first fabrication process. For example, because the via 149 has a different height than the via 168 (e.g., because the MRAM module 160 has been "inserted" between the metallization layers 102, 165), formation of the via 149 may utilize a "custom" mask. Further, in some cases, a height of the via 1270 may specified by a BEOL metallization process associated with the metallization layers 102, 165. Thus, forming the via 1270 (instead of the via 149) to connect the MRAM module 160 to the third metallization layer 165 may reduce a number of masks used during device fabrication. In some applications, use of the first fabrication process may avoid modification of a metallization process used to form the third metallization layer 165 (by avoiding fabrication of the via 1270). Further, the device 100 may have a smaller size as compared to the device 1200 (e.g., by connecting the MRAM module 160 to the third metallization layer 165 using the via 149 instead using of the via 1270, which may be fabricated using a "thick" metallization process and may have a greater size than the via 149). Thus, the first fabrication process or the second fabrication process may be selected based on the particular application.

Figure 13:
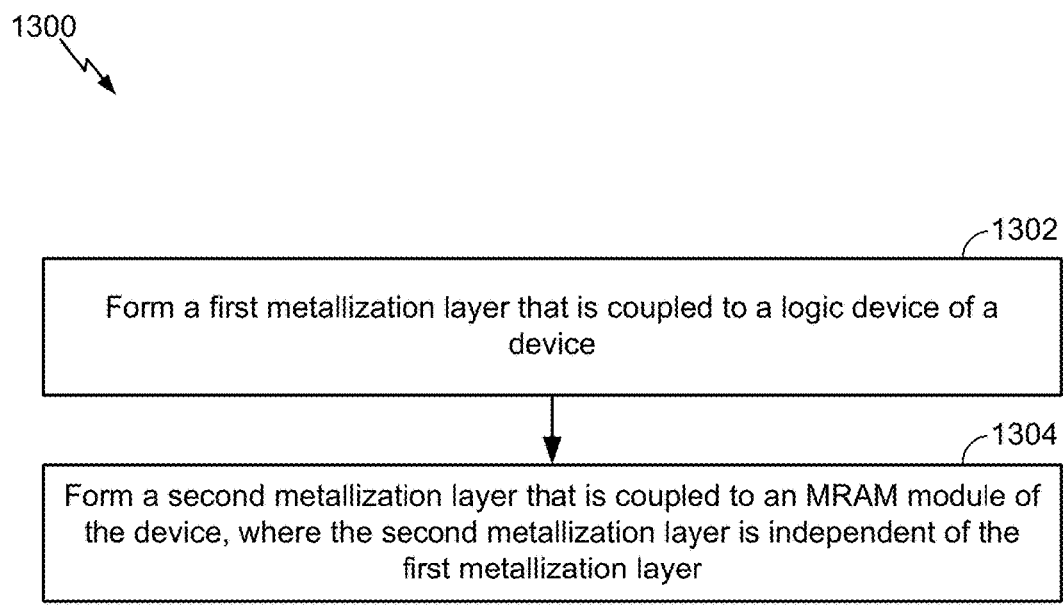
FIG. 13 is a flow chart of a particular illustrative example of a method of fabrication of a device, such as a device fabricated using the first fabrication process of FIGS. 1-7, a device fabricated using the second fabrication process of FIGS. 8-12, or both.

Referring to FIG. 13, a particular illustrative example of a method is depicted and generally designated 1300. The method 1300 may be performed during fabrication of a device, such as during fabrication of the device 100 of FIG. 1 (e.g., using the first fabrication process described with reference to FIGS. 2-7), during fabrication of the device 1200 of FIG. 12 (e.g., using the second fabrication process described with reference to FIGS. 8-12), or both.

The method 1300 includes forming a first metallization layer that is coupled to a logic device of the device, at 1302. To illustrate, the first metallization layer may correspond to the first metallization layer 102, and the logic device may be formed within the region 104.

The method 1300 further includes forming a second metallization layer that is coupled to an MRAM module of the device, at 1304. The MRAM module may correspond to the MRAM module 160, and the second metallization layer may correspond to the second metallization layer 161, as illustrative examples. The second metallization layer is independent of the first metallization layer. For example, the first metallization layer 102 may be "dedicated" to one or more wiring components of a logic device formed within the region 104, As another example, the logic region 116 may be protected (e.g., using the protective device 402) during one or more operations targeting the MRAM region 112 and the edge region 114. For example, one or more components (e.g., the portions 106-108) of the first metallization layer 102 may be "dedicated" to connecting the logic device to one or more other device components, and the second metallization layer 161 may be "dedicated" to connecting the MRAM module 160 to one or more other device components. As another example, the logic region 116 may be protected (e.g., using the protective device 402) during one or more operations targeting the MRAM region 112 and the edge region 114 (so that components of the second metallization layer 161 are formed independently of components of the logic region 116).

The first metallization layer may be formed using a BEOL metallization process, and the second metallization layer may be formed using a metallization process that is dedicated to forming one or more components associated with the MRAM module. The BEOL metallization process may specify a positive integer number n of metallization layers, and the device may include at least n+1 metallization layers. Forming the second metallization layer may include performing a damascene process to form the one or more components. The one or more components may include one or more of a bit line (e.g., the bit line 147) of the MRAM module or a portion of an array contact (e.g., the second portion 148 or the via 149) of the MRAM module.

The method 1300 may optionally include forming a third metallization layer (e.g., the third metallization layer 165) after forming the second metallization layer. The first metallization layer may be associated with a first pitch (e.g., the first pitch 171) that is less than a second pitch (e.g., the second pitch 175) associated with the third metallization layer. The first pitch is a particular pitch (e.g., a "minimum" pitch) that complies with a BEOL metallization process of the device, such as a "minimum" pitch of dense metallization layers specified by the BEOL metallization process. The first metallization layer may have a first density that is greater than a second density associated with the third metallization layer.

Forming the first metallization layer and forming the second metallization layer may be initiated by a processor executing instructions. An example of a processor that executes instructions to fabricate a device is described further with reference to FIG. 14.

Figure 14:
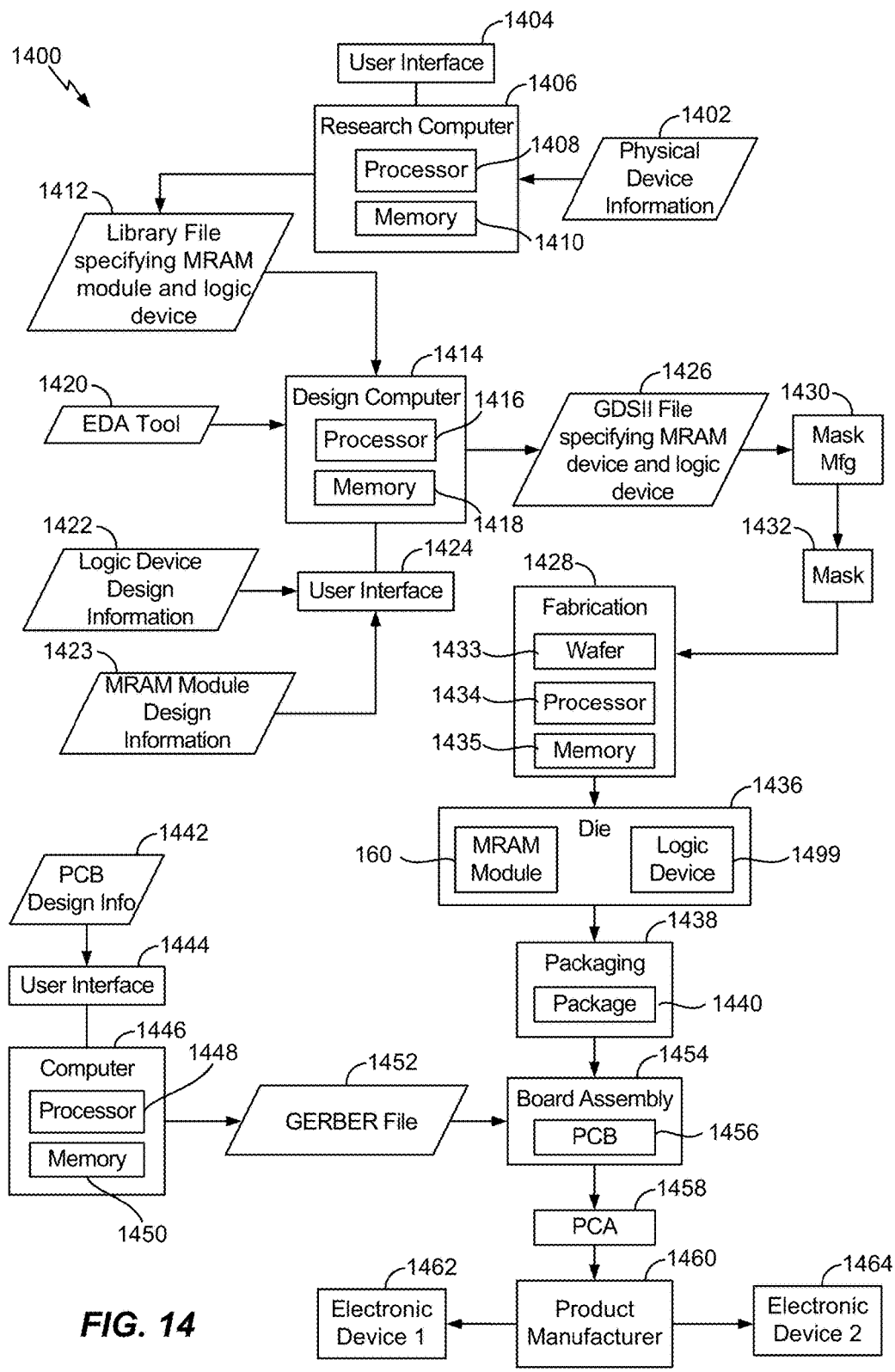
FIG. 14 is a data flow diagram of an illustrative example of a manufacturing process to manufacture one or more electronic devices.

The foregoing disclosed devices and functionalities may be designed and represented using computer files (e.g. RTL, GDSII, GERBER, etc.). The computer files may be stored on computer-readable media. Some or all such files may be provided to fabrication handlers who fabricate devices based on such files. Resulting products include wafers that are then cut into die and packaged into integrated circuits (or "chips"). The chips are then employed in electronic devices. FIG. 14 depicts a particular illustrative embodiment of an electronic device manufacturing process 1400.

Physical device information 1402 is received at the electronic device manufacturing process 1400, such as at a research computer 1406. For example, the physical device information 1402 may include physical parameters, material characteristics, and structure information that is entered via a user interface 1404 coupled to the research computer 1406. The physical device information 1402 may represent one or more features of any of the devices 100-1200 of FIGS. 1-12. The research computer 1406 includes a processor 1408, such as one or more processing cores. The processor 1408 is coupled to a computer-readable medium, such as a memory 1410. The memory 1410 may store computer-readable instructions that are executable by the processor 1408 to transform the physical device information 1402 to comply with a file format and to generate a library file 1412.

The library file 1412 may include at least one data file including the transformed design information. For example, the library file 1412 may specify a library of devices. The library of devices may include one or more components of any of the devices 100-1200 of FIGS. 1-12. The library file 1412 may be used in conjunction with an electronic design automation (EDA) tool 1420 at a design computer 1414. The design computer 1414 includes a processor 1416, such as one or more processing cores. The processor 1416 is coupled to a memory 1418. The EDA tool 1420 may include processor executable instructions stored at the memory 1418 to enable a user of the design computer 1414 to design a circuit.

For example, a user of the design computer 1414 may enter logic device design information via a user interface 1424 coupled to the design computer 1414. The design information may include logic device design information 1422 and MRAM module design information 1423. The logic device design information 1422 and the MRAM module design information 1423 may include design information representing one or more physical properties of any of the devices 100-1200 of FIGS. 1-12. To illustrate, the circuit design properties may include identification of particular circuits and relationships to other elements in a circuit design, positioning information, feature size information, interconnection information, or other information representing a physical property of a device. In an illustrative example, the logic device design information 1422 represents a logic device formed within the region 104 (e.g., a logic device 1499), and the MRAM module design information 1423 represents the MRAM module 160.

The design computer 1414 may be configured to transform the logic device design information 1422 and the MRAM module design information 1423 to comply with a file format. To illustrate, the file format may include a database binary file format representing planar geometric shapes, text labels, and other information related to a circuit layout in a hierarchical format, such as a Graphic Data System (GDSII) format. The design computer 1414 may be configured to generate a data file including the transformed design information, such as a GDSII file 1426 that includes information describing one or more components of any of the devices 100-1200 of FIGS. 1-12.

The GDSII file 1426 may be received at a fabrication process 1428. The fabrication process 1428 may use the GDSII file to fabricate a semiconductor device that includes one or more components of any of the devices 100-1200 of FIGS. 1-12. The fabrication process may include one or more operations of the method 1300 of FIG. 13.

The GDSII file 1426 may be provided to a mask manufacturer 1430 to create one or more masks, such as masks to be used with photolithography processing, illustrated in FIG. 14 as a mask 1432. The mask 1432 may be used during the fabrication process 1428 to generate one or more wafers 1433, which may be tested and separated into dies, such as a die 1436 (e.g., a semiconductor die). The die 1436 may include one or more components of any of the devices 100-1200 of FIGS. 1-12. For example, FIG. 13 illustrates that the die 1436 may include the MRAM module 160 and the logic device 1499 (e.g., a logic device formed in the region 104). The die 1436 may be fabricated using one or more operations of the method 1300 of FIG. 13.

Operations of the fabrication process 1428 may be initiated or controlled using a processor 1434 and a computer-readable medium, such as a memory 1435. The memory 1435 may store instructions that are executable by the processor 1434 to cause the processor 1434 to initiate one or more operations during fabrication of a device (e.g., during fabrication of the die 1436). The operations may include forming a first metallization layer (e.g., the first metallization layer 102) that is coupled to a logic device (e.g., a logic device formed within the region 104) of the device. The method further includes forming a second metallization layer (e.g., the second metallization layer 161) that is coupled to an MRAM module (e.g., the MRAM module 160) of the device. The second metallization layer is independent of the first metallization layer.

The fabrication process 1428 may be implemented by a fabrication system that is fully automated or partially automated. For example, the fabrication process 1428 may be automated according to a schedule. The fabrication system may include fabrication equipment (e.g., processing tools) to perform one or more operations to form a device. For example, the fabrication equipment may be configured to deposit one or more materials, epitaxially grow one or more materials, conformally deposit one or more materials, apply a hardmask, apply an etching mask, perform etching, perform planarization, form a gate stack (e.g., using a metal gate process), perform a shallow trench isolation (STI) process, and/or perform a standard clean 1 process, as illustrative examples.

The fabrication system may have a distributed architecture (e.g., a hierarchy). For example, the fabrication system may include one or more processors, such as the processor 1434, one or more memories, such as the memory 1435, and/or one or more controllers that are distributed according to the distributed architecture. The distributed architecture may include a high-level processor that controls or initiates operations of one or more low-level systems. For example, a high-level portion of the fabrication process 1428 may be initiated or controlled by one or more processors, such as the processor 1434, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the high-level processor. Each of the one or more low-level systems may be associated with one or more corresponding pieces of fabrication equipment, such as one or more processing tools. Example processing tools include doping or deposition tools (e.g., a molecular beam epitaxial growth tool, a flowable chemical vapor deposition (FCVD) tool, a conformal deposition tool, or a spin-on deposition tool) and removal tools (e.g., a chemical removal tool, a reactive gas removal tool, a hydrogen reaction removal tool, or a standard clean 1 removal tool).

In a particular embodiment, the fabrication system may include multiple processors that are distributed in the fabrication system. For example, a controller of a low-level system component may include a processor, such as the processor 1434. Alternatively, the processor 1434 may be a part of a high-level system, subsystem, or component of the fabrication system. In another embodiment, the processor 1434 includes distributed processing at various levels and components of a fabrication system.

The die 1436 may be provided to a packaging process 1438. The packaging process 1438 may incorporate the die 1436 into a package 1440. The package 1440 may include a single die (such as the die 1436) or multiple dies, such as in connection with a system-in-package (SiP) arrangement. The package 1440 may be configured to conform to one or more standards or specifications, such as one or more Joint Electron Device Engineering Council (JEDEC) standards.

Information regarding the package 1440 may be distributed to various product designers, such as using a component library stored at a computer 1446. The computer 1446 may include a processor 1448, such as one or more processing cores, coupled to a memory 1450. A printed circuit board (PCB) tool may be stored as processor executable instructions at the memory 1450 to process PCB design information 1442 received from a user of the computer 1446 via a user interface 1444. The PCB design information 1442 may include physical positioning information of a packaged device on a circuit board. The packaged device may include one or more components of any of the devices 100-1200 of FIGS. 1-12.

The computer 1446 may transform the PCB design information 1442 to generate a data file, such as a GERBER file 1452. The GERBER file 1452 may indicate physical positioning information of a packaged device on a circuit board, as well as layout of electrical connections, such as traces and vias. The physical positioning information may correspond to (e.g., may be generated based on) one or more structures of any of the devices 100-1200 of FIGS. 1-12. In some implementations, the data file generated by transforming PCB design information 1442 may have a format other than a GERBER format.

The GERBER file 1452 may be received at a board assembly process 1454 and used to create PCBs, such as a PCB 1456. The PCB 1456 may be manufactured in accordance with the design information indicated by the GERBER file 1452. For example, the GERBER file 1452 may be uploaded to one or more machines to perform one or more operations of a PCB production process. The PCB 1456 may be populated with electronic components including the package 1440 to form a printed circuit assembly (PCA) 1458. The electronic components may include one or more structures of any of the devices 100-1200 of FIGS. 1-12.

The PCA 1458 may be received at a product manufacture process 1460 and integrated into one or more electronic devices, such as a first electronic device 1462 and a second electronic device 1464. The first electronic device 1462 and the second electronic device 1464 may each include a mobile device (e.g., a cellular telephone), as an illustrative example. In other implementations, first electronic device 1462 and the second electronic device 1464 may each correspond to a computer (e.g., a laptop computer, a tablet computer, or a desktop computer), a wearable electronic device (e.g., a personal camera, a head-mounted display, or a watch), a vehicle control system or console, a home appliance, a set top box, an entertainment unit, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a fixed location data unit, a robot, a healthcare device, another electronic device, or a combination thereof.

One or more aspects of the embodiments described with respect to FIGS. 1-14 may be represented by the library file 1412, the GDSII file 1426, and/or the GERBER file 1452. One or more aspects of the examples described with respect to FIGS. 1-14 may be represented by information stored at the memory 1410 of the research computer 1406, the memory 1418 of the design computer 1414, the memory 1450 of the computer 1446, and/or a memory of one or more other computers or processors (not shown) used at the various stages, such as at the board assembly process 1454. One or more aspects of the embodiments described with respect to FIGS. 1-14 may be can also be incorporated into one or more other physical embodiments, such as the mask 1432, the die 1436, the package 1440, the PCA 1458, one or more other products such as prototype circuits or devices (not shown), or a combination thereof. Although various illustrative stages of production from a physical device design to a final product are depicted, in other implementations fewer stages may be used or additional stages may be included. The electronic device manufacturing process 1400 may be performed by a single entity or by one or more entities performing various stages of the electronic device manufacturing process 1400.

Figure 15:
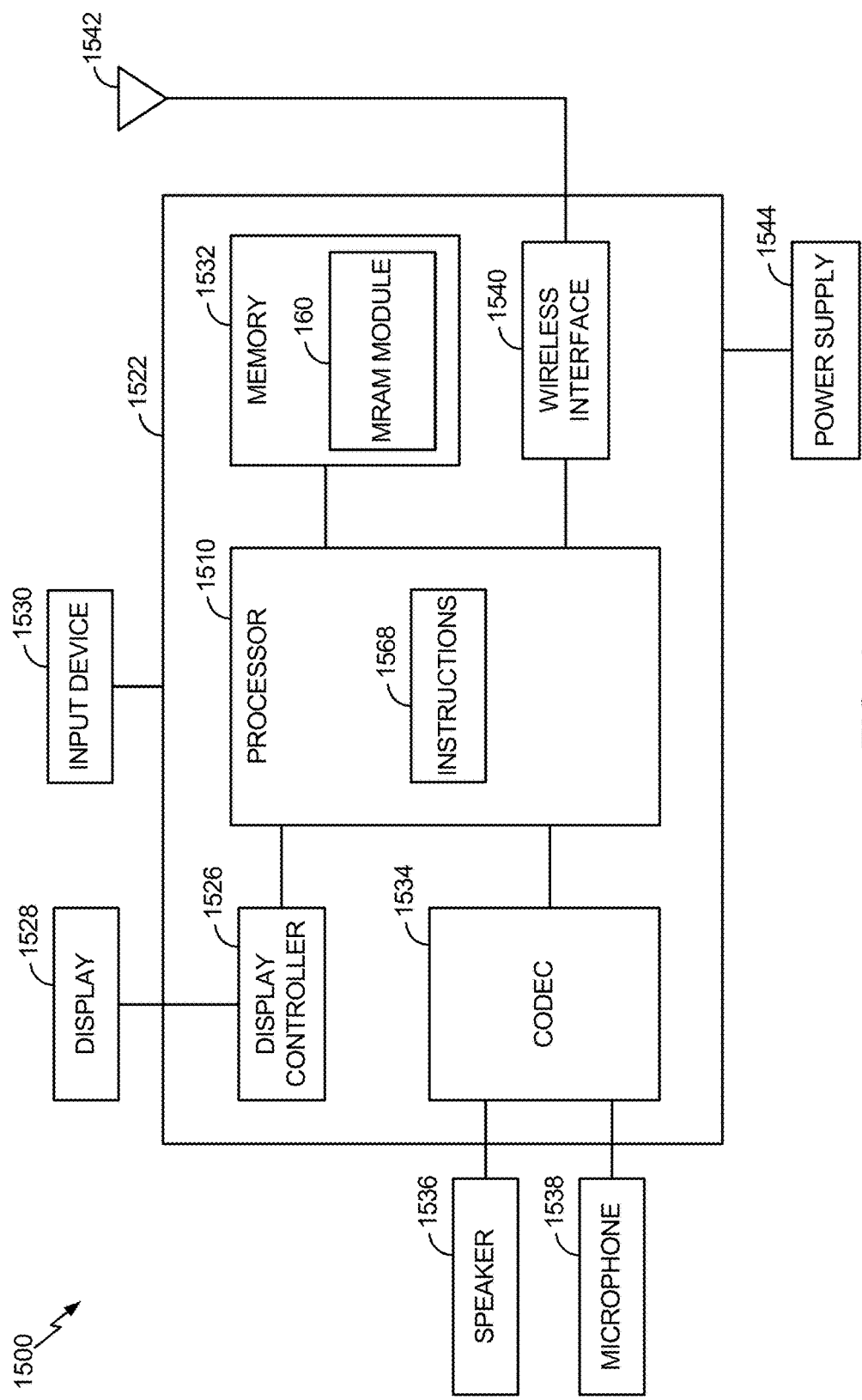
FIG. 15 is a block diagram of an illustrative example of an electronic device.

Referring to FIG. 15, a block diagram of a particular illustrative embodiment of an electronic device is depicted and generally designated 1500. The electronic device 1500 may correspond to one or more of the first electronic device 1462 and the second electronic device 1464 of FIG. 14.

The electronic device 1500 includes a processor 1510, such as a digital signal processor (DSP), a central processing unit (CPU), a graphics processing unit (GPU), another processing device, or a combination thereof. The processor 1510 may be configured to execute instructions, such as instructions 1568. The processor 1510 may be formed within the region 104. Alternatively or in addition, one or more other components of the electronic device 1500 may be formed within the region 104. The processor 1510 may correspond to the logic device 1499. Alternatively or in addition, one or more other components of the electronic device 1500 may be correspond to the logic device 1499.

The electronic device 1500 may further include a memory 1532. The memory 1532 may be coupled to or integrated within the processor 1510. The memory 1532 may include the MRAM module 160.

FIG. 15 also shows a display controller 1526 that is coupled to the processor 1510 and to a display 1528. A coder/decoder (CODEC) 1534 can also be coupled to the processor 1510. A speaker 1536 and a microphone 1538 can be coupled to the CODEC 1534. FIG. 15 also indicates that a wireless interface 1540 (such as one or more of a wireless controller or a transceiver) may be coupled to the processor 1510 and to an antenna 1542.

In a particular example, the processor 1510, the display controller 1526, the memory 1532, the CODEC 1534, and the wireless interface 1540 are included in a system-in-package or system-on-chip device 1522. The system-on-chip device 1522 may correspond to the die 1436. Further, an input device 1530 and a power supply 1544 may be coupled to the system-on-chip device 1522. Moreover, in a particular example, the display 1528, the input device 1530, the speaker 1536, the microphone 1538, the antenna 1542, and the power supply 1544 are external to the system-on-chip device 1522. However, each of the display 1528, the input device 1530, the speaker 1536, the microphone 1538, the antenna 1542, and the power supply 1544 can be coupled to a component of the system-on-chip device 1522, such as to an interface or to a controller.

In a particular example, an apparatus includes a first structure (e.g., any of the portions 106-108 and the via 110) of a first metallization layer (e.g., the first metallization layer 102). The first structure is coupled to a logic device (e.g., a logic device formed within the region 104) of an integrated circuit (e.g., the die 1436 or the system-on-chip device 1522). The apparatus further includes a second structure (e.g., the bit line 147) of a second metallization layer (e.g., the second metallization layer 161). The second structure is coupled to one or more resistance-based storage elements (e.g., the resistance-based storage element 226) of an MRAM module (e.g., the MRAM module 160) of the integrated circuit. The second structure is independent of the first structure. The apparatus may be represented using design information, such as the GDSII file 1426.

Although certain examples are described with reference to a logic device, it should be appreciated that other implementations are within the scope of the disclosure. For example, in some cases, a memory device may be formed in the region 104. In this case, the MRAM module 160 may function as redundant storage (e.g., in case of a manufacturing defect associated with the memory device), as an illustrative example. Alternatively or in addition, the region 104 may include one or more other devices. Further, although certain examples are described with reference an MRAM device (e.g., the MRAM module 160), in other cases one or more other devices may be formed using the second metallization layer 161 (e.g., another memory device).

In the drawings, certain features may be omitted for clarity of illustration. For example, a device described herein may include one or more components (e.g., wiring) omitted from the drawings for clarity. It is noted that one of skill in the art will recognize that such features may be selected based on the particular application without departing from the scope of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. For example, one or more operations of the method 1300 may be initiated, controlled, or performed by a field-programmable gate array (FPGA) device, an application-specific integrated circuit (ASIC), a processing unit such as a central processing unit (CPU), a digital signal processor (DSP), a controller, another hardware device, a firmware device, or a combination thereof. A software module may reside in random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a first structure of a first metallization layer, the first structure coupled to a logic device of an integrated circuit; and
   a second structure of a second metallization layer, the second structure coupled to one or more resistance-based storage elements of a magnetoresistive random access memory (MRAM) module of the integrated circuit, wherein the second metallization layer is a different metallization layer than the first metallization layer,
   wherein the second structure is formed using one or more different metallization layers as compared to the first structure, and wherein the MRAM module includes a module contact, a coupling element coupled to the module contact, and an array contact.

2. The apparatus of claim 1, wherein the first structure includes a contact or a via, wherein the second structure includes a bit line of the MRAM module, and wherein the first metallization layer is formed using a back-end-of-line (BEOL) metallization process, and wherein the second metallization layer is formed using a metallization process that is dedicated to forming one or more components associated with the MRAM module.

3. The apparatus of claim 1, further comprising a third structure of a third metallization layer, wherein the first metallization layer is associated with a first pitch that is less than a second pitch associated with the third metallization layer, wherein the second metallization layer is configured to utilize the first pitch of the first metallization layer to form one or more components associated with the MRAM module, and wherein the one or more components include resistance-based storage elements.

4. The apparatus of claim 3, wherein the third structure includes a metal region or a via.

5. The apparatus of claim 1, further comprising a semiconductor die that includes the first structure and the second structure.

6. The apparatus of claim 5, further comprising a device selected from a group consisting of a mobile device, a computer, a set top box, an entertainment unit, a navigation device, a personal digital assistant (PDA), a monitor, a television, a tuner, a radio, a satellite radio, a music player, a digital music player, a portable music player, a video player, a digital video player, a digital video disc (DVD) player, a portable digital video player, and a fixed location data unit, wherein the semiconductor die is integrated within the device.

7. The apparatus of claim 1, wherein the second metallization layer is not shared with wiring components of the logic device.

8. The apparatus of claim 1, wherein the second metallization layer is dedicated to one or more wiring components of the MRAM module.

9. The apparatus of claim 1, wherein the first metallization layer is dedicated to one or more wiring components of the logic device.

* * * * *